(12) United States Patent  
Kraz

(10) Patent No.: US 6,700,385 B2  
(45) Date of Patent: Mar. 2, 2004

(54) APPARATUS AND METHOD FOR DETECTION AND MEASUREMENT OF ENVIRONMENTAL PARAMETERS

(75) Inventor: Vladimir Kraz, Santa Cruz, CA (US)

(73) Assignee: Credence Technologies, Inc., Soquel, CA (US)

( * ) Notice: Subject to any disclaimer, the term of this patent is extended or adjusted under 35 U.S.C. 154(b) by 0 days.

(21) Appl. No.: 10/278,589

(22) Filed: Oct. 22, 2002

(65) Prior Publication Data

US 2003/0048107 A1 Mar. 13, 2003

Related U.S. Application Data

(62) Division of application No. 09/876,200, filed on Jun. 6, 2001, now Pat. No. 6,614,235.

(51) Int. Cl.⁷ .......................... G01R 29/12; H01L 21/66
(52) U.S. Cl. ............................ 324/457; 438/14
(58) Field of Search ................. 324/457, 458, 324/452, 72, 72.5; 343/701, 703; 375/219, 220; 438/275, 14, 19

(56) References Cited

U.S. PATENT DOCUMENTS 4,975,686 A * 12/1990 Delcourt .................... 340/659
6,091,764 A * 7/2000 Silk et al. .................. 375/219
6,144,341 A * 11/2000 Kraz .......................... 343/703

* cited by examiner

*Primary Examiner*—N. Le
*Assistant Examiner*—James Kerveros
(74) *Attorney, Agent, or Firm*—Gray Cary Ware & Freidenrich LLP

(57) ABSTRACT

The present invention provides a device for in-situ measurement and recording of various environmental parameters in a semiconductor fabrication process. The device comprises sensors for detecting the parameters and converting them to sensor outputs; and a data logger coupled to the sensors for receiving the sensor outputs and logging them in a file. The device may also comprise an analog to digital converter to convert the sensor outputs to digital data and a communication module to communicate the digital data with other devices. When applied to reticles used in a semiconductor fabrication process comprising a plurality of stages, the device may be used to monitor electrostatic field and electrostatic discharge activities on and around the reticle, convert the monitored parameters into data, and log the data along with a timestamp and an identification of each individual stage. Logged data can be retrieved and analyzed to determine the time and location of detrimental activities such as electrostatic discharge on reticles.

25 Claims, 10 Drawing Sheets

APPARATUS AND METHOD FOR DETECTION AND MEASUREMENT OF ENVIRONMENTAL PARAMETERS

This is a divisional of application Ser. No. 09/876,200, filed on Jun. 6, 2001, now U.S. Pat. No. 6,614,235, entitled: APPARATUS AND METHOD FOR DETECTION AND MEASUREMENT OF ENVIRONMENTAL PARAMETERS.

FIELD OF THE INVENTION

This invention relates generally to a system and method for monitoring process and environmental parameters in a manufacturing or other process and in particular to a monitoring system for a process where it is not possible to use conventional monitoring methods due to movements of the monitored object.

BACKGROUND OF THE INVENTION

It is desirable to be able to monitor various process and environmental parameters associated with a process to determine how well the process is functioning. For example, the temperature of a CVD (chemical vapor deposition) process (a critical parameter associated with the CVD process) may indicate the quality of the film being deposited by the CVD process at the time in question. For a non-moving object, there are many conventional process monitoring systems which permit various parameters to be determined. Unfortunately, it is difficult for such a conventional system to be used with a object that is moving during the process in question. To better understand the problem, an example of a particular moving object (e.g., a reticle in a semiconductor manufacturing process) that needs to be monitored will be described, but it should be understood that the problem is associated with any moving object that needs to be monitored.

A reticle in a semiconductor manufacturing process is a specially made photo "negative" used to expose a photo-sensitized semiconductor wafer prior to etching in order to ultimately produce a plurality of integrated circuits (IC) on the semiconductor wafer. A typical reticle is made of quartz with thin chrome traces on it representing the desired electrical connections for the particular IC. Modern recticles with small geometry (e.g., very fine lines and a small spacing between the lines corresponding to the very close electrical traces on moderns ICs) are particularly sensitive to various environmental and process parameters, such as exposure to electrostatic voltages. As a result of this exposure, the thin traces on the reticle can be damaged or destroyed and the process engineer may not realize that the reticle has been damaged.

Even a small number of damaged reticles can cause disproportionately large losses because the damaged reticles can go undetected and be used in a photolithography process to produce a large number of defective ICs, which are expensive to manufacture. Further, in addition to replacement costs of defective ICs and reticles, the down time of a fabrication facility may significantly add to the losses. Thus, it is necessary to detect and replace defective or damaged reticles from the semiconductor fabrication process as early as possible. Unfortunately, the sources of electrostatic damage for reticles are varied and unpredictable because reticles go through a number of different handling stages for use in a semiconductor fabrication process. For example, reticles stored in a storage place must be retrieved and loaded into a loader. Then the reticles are loaded from the loader to a stepper that is used in a photolithography process. After use, reticles are unloaded from the stepper back into the loader and carried back to the storage place. Reticles also go through several testing stages where they are subjected to various physical tests.

If a reticle comes into close proximity with an electric charge bearing object during any of the handling or testing stages, it may sustain electrostatic discharge damages. For example, the test pads on which the reticles are placed may be a source of electric discharge. Even if the reticle does not sustain an immediate electrostatic discharge damage, the effect may accumulate in the reticle, so that the reticle becomes more and more vulnerable to electrostatic discharges.

Thus, it is desirable to provide monitoring capability for reticles' exposure to electrostatic damages so that the process engineer would be able to identify and inspect exposed reticles in order to detect damaged reticles prior to beginning the fabrication. The monitoring would also permit the process engineer to identify specific occurences of exposure in order to try to reduce those exposures in the future. The problem with using typical monitoring system is that the reticles travel throughout the semiconductor fabrication facility and it is impossible to monitor them at all times with stationary monitors.

Some attempts have been made to provide portable data storage systems that can travel along with the reticle in the reticle storage pod, such as Smart-Tag system by Asyst. This system consists of a miniature data storage device and an RF-ID module that can communicate with a corresponding stationary device that reads and writes data into the tag that moves with the reticle. This system, however, does not observer or record any in-process parameters.

Other conventional devices provide rudimentary means for recording parameters such as exposure to electrostatic charges. An example of it is the "Ex-Mod" device by Ex-mod Corporation and Static Bug by ElectroStatic Designs. These devices must be installed on the host (i.e. on a circuit board or a wafer) that goes through the process. They provide indications that a parameter (e.g., electrostatic exposure) has exceeded a certain level somewhere along the process. However, they do not provide information to correlate collected data points to a specific step in the process or a time frame during the process. Thus, data provided by conventional monitoring devices are difficult to interpret and analyze. Also the conventional monitoring devices are difficult to reset, and they must be completely replaced for re-use.

Thus, it is desirable to provide an in-situ monitoring of various parameters, such as electrostatic discharges and damages, that overcomes the above limitations and problems with conventional monitoring systems. It is also desirable to provide a data logger system so that parameters monitored in situ may be logged and communicated for further processing. It is to these ends that the present invention is directed.

SUMMARY OF THE INVENTION

The present invention provides a device for in-situ measurement and recording of various environmental parameters in a manufacturing process such as a semiconductor fabrication process The device comprises sensors for detecting the parameters and converting them to sensor outputs; and a data logger coupled to the sensors for receiving the sensor outputs and logging them in a file. The device may also comprise an analog to digital converter to convert the sensor outputs to digital data and a communication module to communicate the digital data with other devices or to a centralized base station.

The communication module may comprise an RF (radio frequency) transmitter and a receiver to allow operators to interact with the device for downloading of the collected data and control of the device. The sensors on the device may include an electrostatic field sensor to detect and measure a presence or change in electrostatic field, and an electrostatic discharge sensor to detect and measure an electrostatic discharge. The data logger permits the device to continuously monitor and collect the necessary sensor data as well as timestamp them. The timestamped sensor data can be downloaded at a convenient time for subsequent analysis. Alternatively, the collected data may be presented on a built-in visual display for immediate inspection.

When applied to reticles used in a semiconductor fabrication process comprising a plurality of stages, the device may be used to monitor electrostatic field and electrostatic discharge (ESD) activities around the reticle, convert the monitored parameters into data, and log the data along with an identification of each individual stage. Logged data can be retrieved and analyzed to determine the time and location of detrimental activities such as electrostatic discharge on reticles. When there is a combined occurrence of electrostatic discharge and electrostatic field from the monitored readings, it is likely to indicate a valid local ESD event. Extraneous electrostatic discharges may be filtered and excluded using various criteria based on the sensor outputs.

DETAILED DESCRIPTION OF A PREFERRED EMBODIMENT

The invention is particularly applicable to the monitoring of processes and environmental parameters wherein the monitored object is mobile and it is in this context that the invention will be described. While the invention will be described in conjunction with the preferred embodiments, it is understood that the description is not intended to limit the invention to these embodiments. Rather the invention is intended to cover alternatives, modifications and equivalents, which may be included within the scope of the invention. For ease of explanation, the following description will focus specifically on processes and environmental parameters associated with reticles used in a semiconductor fabrication process. The processes monitored include, but are not limited to, retrieval of reticles from storage area, loading of reticles into steppers, and scanning of the reticles in a photolithographic process. The parameters monitored include, but are not limited to, a reticle serial number, process tracking information, presence of electrostatic fields, magnitude of electrostatic fields, polarity of electrostatic discharges and magnitude of electrostatic discharges. However, it will be appreciated that the system and method in accordance with the invention have greater utility, and may be extended beyond the semiconductor fabrication process to any other process which require monitoring of environmental parameters.

Figure 1:
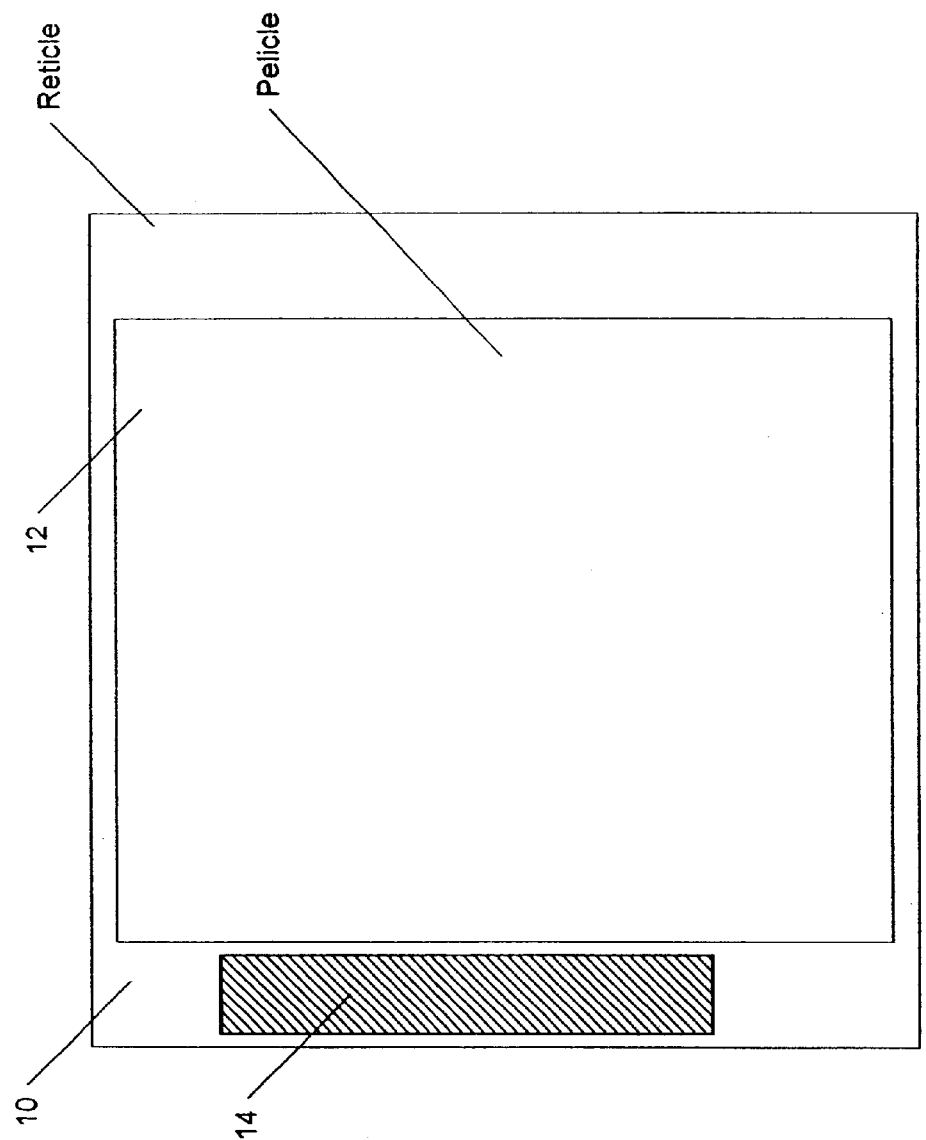
FIG. 1 illustrates an example of a device in accordance with the invention that is attached to a product in process of being manufactured or otherwise processed.

FIG. 1 illustrates an example of a device in accordance with the invention that is attached to a product in the process of being manufactured or otherwise processed. In particular, a reticle 10 with a pellicle (a protective clear film) 12 is used in photolithography process as described above and as is well known. A logging device 14 in accordance with the invention is attached to the reticle 10 in a fashion that does not impede the processing of the reticle. Similarly, the logging device 14 may be attached to any object in a non-invasive fashion wherein the object is moving through a manufacturing process. Now, an embodiment of the data logging system will be described.

Figure 2:
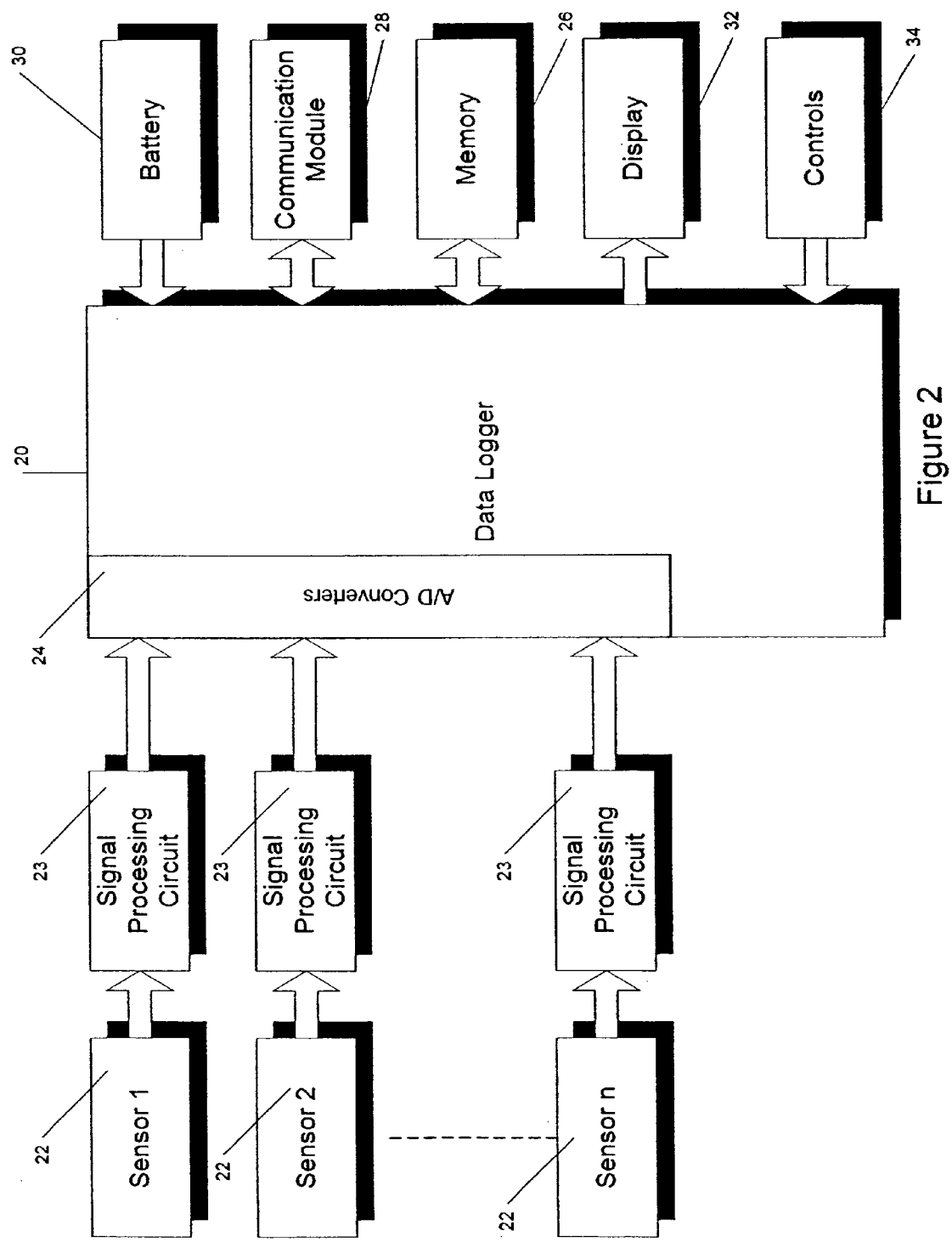
FIG. 2 illustrates a block diagram of one embodiment of the data logging system in accordance with the invention.

FIG. 2 illustrates a block diagram of one embodiment of the data logging system in accordance with the invention. In particular, a data logger 20 (that may be an ASIC, a piece of hardware circuitry or one or more pieces of software being executed by a processor) collects data from one or more well known sensors 22 (Sensor 1, Sensor 2, . . . Sensor n). Each sensor provides data about one or more parameters important to the user. For reticle handling, for example, it is important to know such parameters as 1) the presence and strength of an ESD events; and 2) the rate of change and magnitude of the electrostatic fields. Other parameters can be measured as well since various different types of sensors can be connected to the data logger 20. The signal from each sensor may be conditioned and processed by a signal processing circuit 23 if needed. The processed signal then is provided to said data logger 20 which may contain one or more analog-to-digital converters 24 that converts the analog sensor signals into digital data as is well known in the art. Analog to digital conversion is used to enable storage and communication of data in digital format instead of analog format. It is also possible that a sensor may generate a digital signal and an A/D converter 24 may not be required. The data logger 20 may operate with sensors that generate analog signals as well as sensors that generate digital signals.

The data logger 20 records the collected data into a memory 26 that may be attached to the data logger as shown in FIG. 2 or incorporated into the data logger. The memory 26 may be implemented by a flash memory, a RAM (random access memory), or other storage devices. Preferably, the data logger 20 comprises a timestamping module in order to time stamp the information logged into the memory 26. Any well-known technique may be used to implement the timestamping module. For example, the data logger 20 may have an internal clock circuitry such as based on a crystal oscillator to keep track of time. Alternatively, the timestamping module may use an external clock circuitry to keep track of time. Preferably, the timestamping module comprises software residing in an internal or external memory to monitor the clock and record time in the memory 26 along with the collected data.

Unlike conventional ESD detectors, the invention allows continuous monitoring of environmental parameters. In typical ESD detectors, once an ESD event occurs, it blows the circuitry, terminating any subsequent EDS event monitoring. In contrast, the invention allows continuous monitoring and data logging by providing a data logger so that sensor data can be collected and saved in a memory. The sensor data saved in the memory can be retrieved at any convenient time for further processing and analysis.

The communication between the data logger 20 and other equipment is done with the help of a communication module 28. A power signal is provided to the data logger 20 by a battery 30 (disposable or rechargeable) or via other power sources. In an alternate embodiment of the invention, data from data logger 20 may be displayed on a built-in display 32, such as a liquid crystal display (LCD) or the like. In yet another embodiment of the invention, optional control components 34 (i.e. switches, etc.) can be used to locally control the data logger 20.

The data logging unit can be made using discrete components or using an integrated component containing all or some of its parts in one integrated solution, such as IC or MCM (multi-chip module) as should be obvious to one skilled in art.

Figure 3:
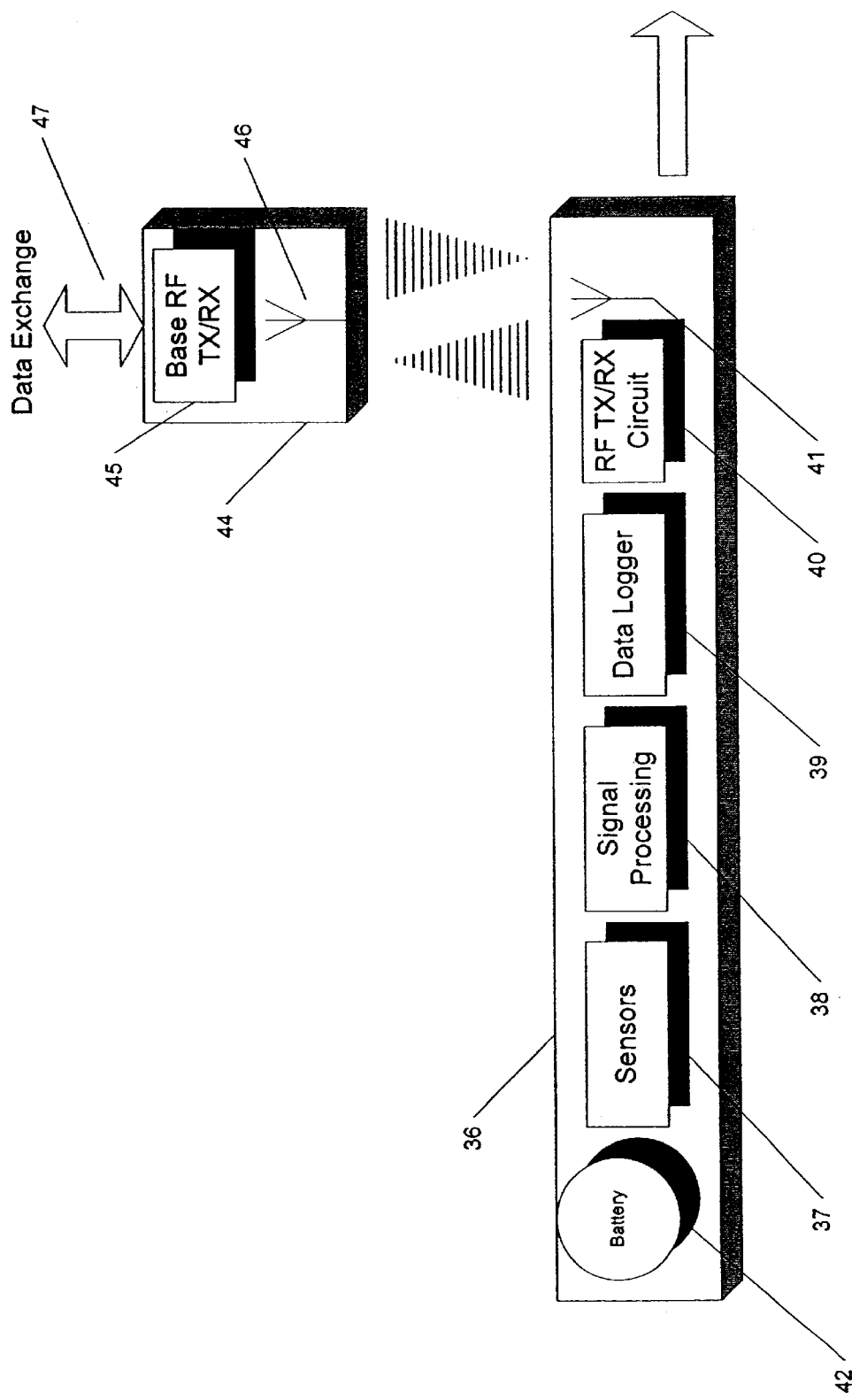
FIG. 3 illustrates a data logging unit 36 in accordance and base equipment 44 in accordance with one embodiment of the invention.

FIG. 3 illustrates a data logging unit 36 in accordance and base equipment 44 in accordance with one embodiment of the invention. In a preferred embodiment of the invention, the base equipment 44 comprises a base RF transmit/receive circuit 45 and an antenna 46. In a preferred embodiment, the data logging unit 36 embodies a battery 42, sensors 37, a signal processing circuit 38, a data logger 39, an RF transmit/receive circuit 40, and an antenna 41 in a linear arrangement so that the whole unit 36 can be enclosed in a small unobtrusive package and fit on the side of the reticle 10 as illustrated in FIG. 1. However, it will be apparent to one skilled in the art that other configurations or arrangements of the components inside the unit 36 are possible.

In operation, sensors 37 convert parameters of interest into electric signals, which are conditioned by a signal processing circuit 38. In an alternate embodiment of the invention, the signal processing circuit 38 is not required for the data logging unit 36. Processed signals are recorded or otherwise processed by the data logger 39.

Exchange of information between the data logger 39 and external equipment may be done by the RF transmit/receive circuit 40 and the antenna 41. The types of information communicated by the data logging unit 36 include data, control signals for the data logger 39, reticle identification information, and process tracking information. It will be apparent to one skilled in the art that other types of information may also be communicated. Data exchange may be continued with other devices or a centralized base station using conventional communication means 47. For example, an RF ID (radio frequency identification) technique can be used as the communication means 47.

The base equipment 44 may also have the capability to both transmit and receive data with the data logger unit 36 via the base RF transmit/receive circuit 45 and the antenna 46 so that data parameters of interest that are recorded in the data logger 39 can be retrieved by the base equipment for further processing. The base equipment 44 may also transmit control signals to the data logging unit 36 in order to set its parameters and give instructions.

In contrast to conventional ESD detectors, the sensor data can be automatically collected by the base equipment 44 without the need for a manual inspection of the ESD sensor device by using the RF transmit/receive circuit 40. Further, the transmission and reception of the sensor data can be handled by using conventional techniques without having to change or reinstall communication equipment. Thus, the invention enables an interrupt-free, seamless incorporation of the ESD monitoring process into the semiconductor fabrication process.

Figure 4:
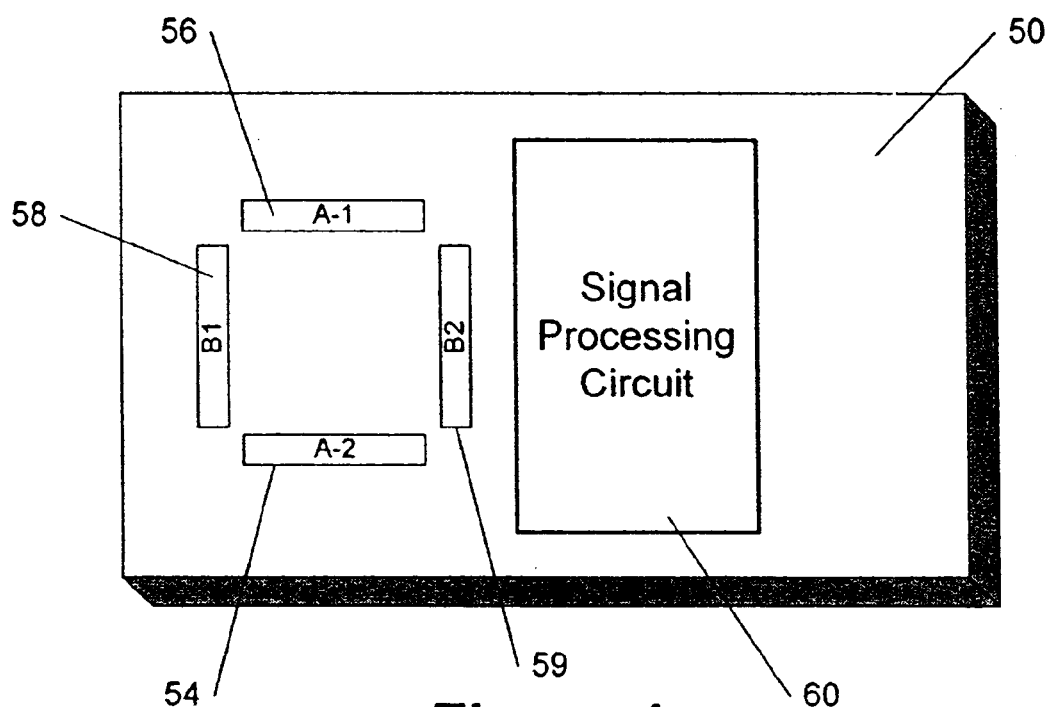
FIG. 4 illustrates an example of a device 50 with an electrostatic sensor and a signal processing circuit for detecting and measuring changing electrostatic field in accordance with one embodiment of the invention.

FIG. 4 illustrates an example of a device 50 with a, electrostatic sensor and a signal processing circuit for detecting and measuring changing electrostatic field in accordance with one embodiment of the invention. The electrostatic field is monitored because a sufficiently strong change in electrostatic field can be a cause of damage or harm to a reticle. In FIG. 4, an electrostatic sensor comprising two pairs of sensor plates (A-1, A-2, B-1 and B-2) including 54, 56 and 58, 59 respectively, is coupled to a signal processing circuit 60.

In operation, the sensors A and B of FIG. 4 receive different electric signals when an electrically charged object generating static field approaches the sensor plates from a horizontal direction. The electrical signals from the sensor plates A and B are then provided to the signal processing circuit 60 for further processing. It will be apparent to one skilled in the art that by adding more sensor plates and modifying the geometry of the sensor plates, it is possible to detect changes in electrostatic field from all directions (360 degrees in all spatial planes).

Figure 5:
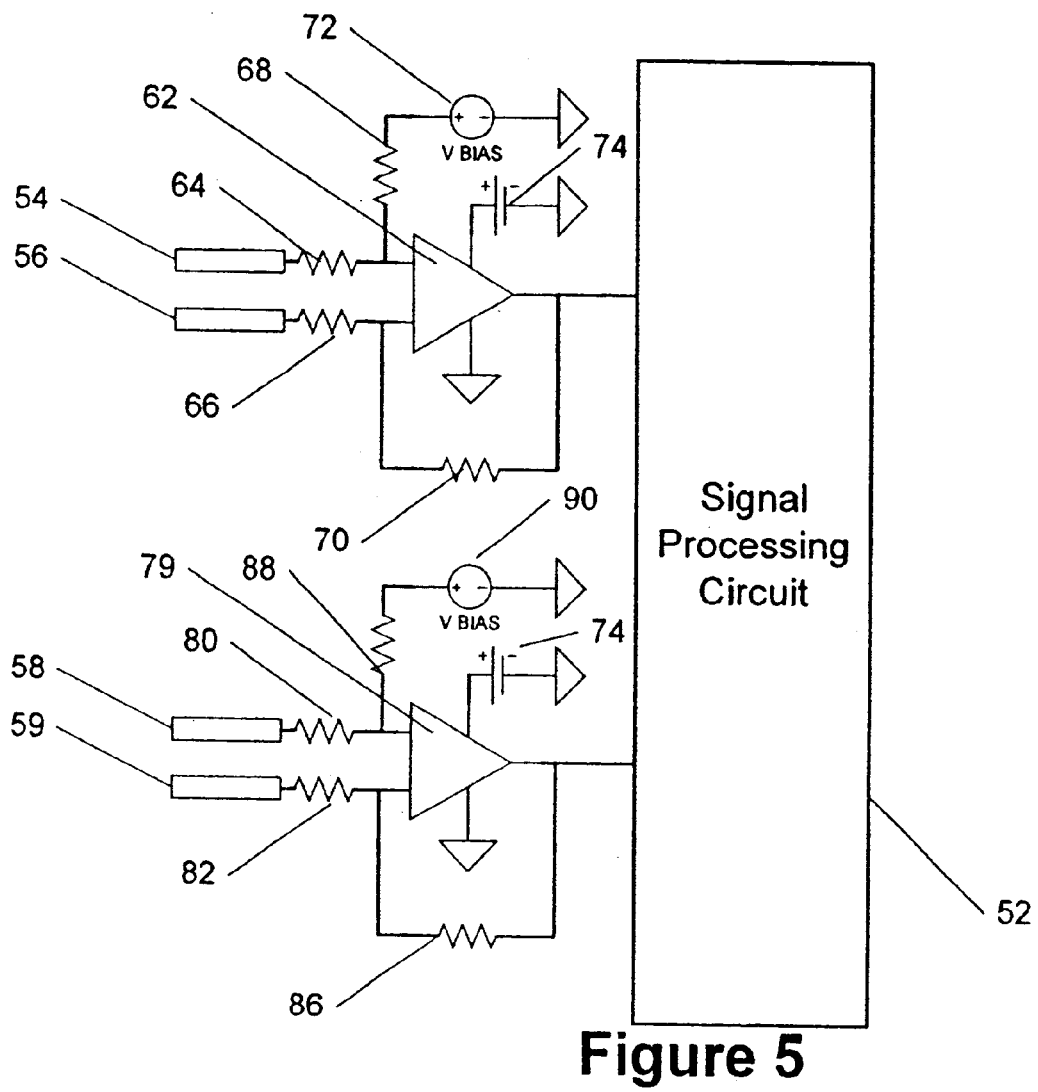
FIG. 5 illustrates a detailed schematic diagram of an electrostatic sensor and a signal processing circuit for detecting and measuring changing electrostatic field using the device of FIG. 4 in accordance with one embodiment of the invention.

FIG. 5 illustrates a detailed schematic diagram of an electrostatic sensor and a signal processing circuit for detecting and measuring changing electrostatic field using the device of FIG. 4 in accordance with one embodiment of the invention. In FIG. 5, the sensor elements 54 and 56 are coupled to an operational amplifier (op amp) 62 via resistors 64 and 66, respectively. The op amp 62 is coupled to a signal processing circuit 52. The resistor 64 is coupled to ground via a resistor 68 and a bias supply circuit 72. The resistor 66 is also coupled to a resistor 70. The sensor elements 58 and 59 are coupled to an operational amplifier (op amp) 79 via resistors 80 and 82, respectively. The op amp 79 is coupled to the signal processing circuit 52. The resistor 80 is coupled to ground via a resistor 88 and a bias supply circuit 90. The resistor 82 is also coupled to a resistor 86. A battery 74 or other suitable power source is provided to power the op amp 62.

In operation, the op amp 62 and resistors 64, 66, 68 and 70 amplify the difference in voltage generated by the sensor elements 54 and 56, and provide the amplified signal to the signal processing circuit 52. The bias supply circuit 72 is used to establish operating parameters of the circuit as is well-known in the art. In one embodiment of the invention, the sensors 54 and 56 detect a magnitude of changing electrostatic field and feeds the information to the signal processing circuit 52. The op amp 79 and resistors 80, 82, 86, and 88 amplify the difference in voltage generated by the sensor elements 58 and 59, and provide the amplified signal to the signal processing circuit 52. Using four (4) sensor elements, 54, 56, 58 and 59, permits to determine the direction of electrostatic field as well as its presence.

Figure 6:
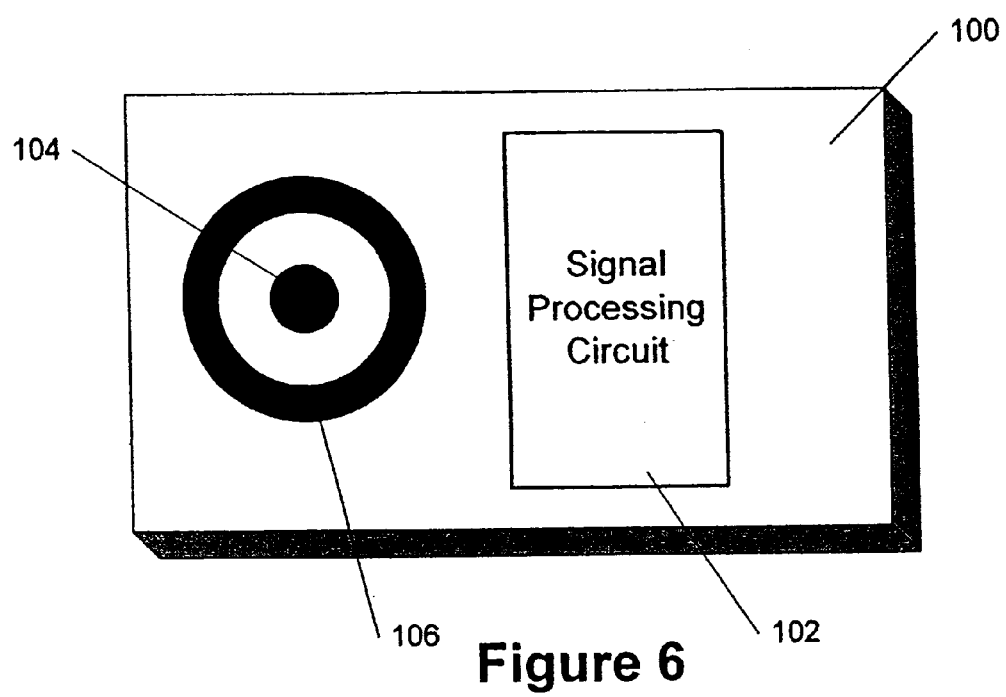
FIG. 6 illustrates an example of a device 100 with a double electrode sensor and a signal processing circuit for detecting and measuring changing electrostatic field in accordance with one embodiment of the invention.

FIG. 6 illustrates an example of a device 100 with a double electrode sensor and a signal processing circuit for detecting and measuring electrostatic field in accordance with one embodiment of the invention. In FIG. 6, an electrostatic sensor comprising circular electrodes 104 and 106 are coupled to a signal processing circuit 102. Compared to the circuit shown in FIG. 4, the circuit of FIG. 6 is simpler and smaller because of reduced number of circuit components. However, the circular sensor of FIG. 6 is not capable of determining the direction of electrostatic field whereas the sensor of FIGS. 4 and 5 can determine the direction of electrostatic field.

Figure 7:
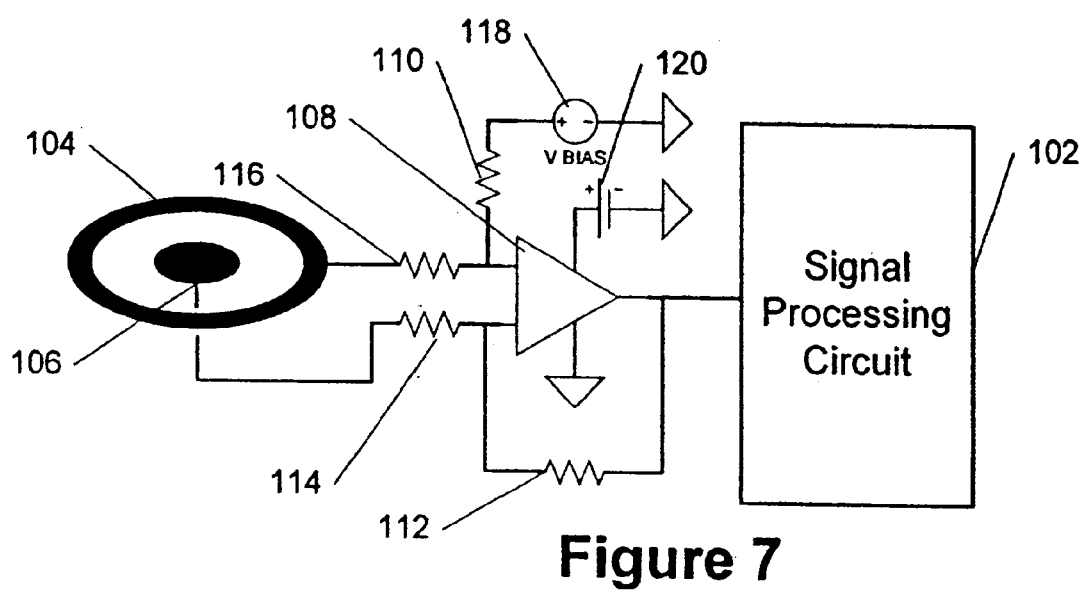
FIG. 7 illustrates a detailed schematic diagram of the sensor elements 104 and 106 and the signal processing circuit 102 of FIG. 6 in accordance with one embodiment of the invention.

FIG. 7 illustrates a detailed schematic diagram of double circular sensor elements 104 and 106, and the signal processing circuit 102 of FIG. 6 in accordance with one embodiment of the invention. In FIG. 7, an electrostatic sensor comprising the circular sensor elements 104 and 106 is coupled to an op amp 108 via resistors 114 and 116 respectively. The op amp 108 is coupled to the signal processing circuit 102. The resistor 116 is coupled to ground via a resistor 110 and a bias supply circuit 118. The resistor 114 is also coupled to a resistor 112. A battery 120 or other suitable power source is provided to power the op amp 108.

In operation, the op amp 108 and resistors 114 and 116 amplify the difference in voltage generated by the sensor elements 104 and 106, and provide the amplified signal to the signal processing circuit 102. The bias supply circuit 118 is used to establish operating parameters of the circuit as is well-known in the art. The sensors 104 and 106 may detect a magnitude of changing electrostatic field and feed the information to the signal processing circuit 102.

Figure 8:
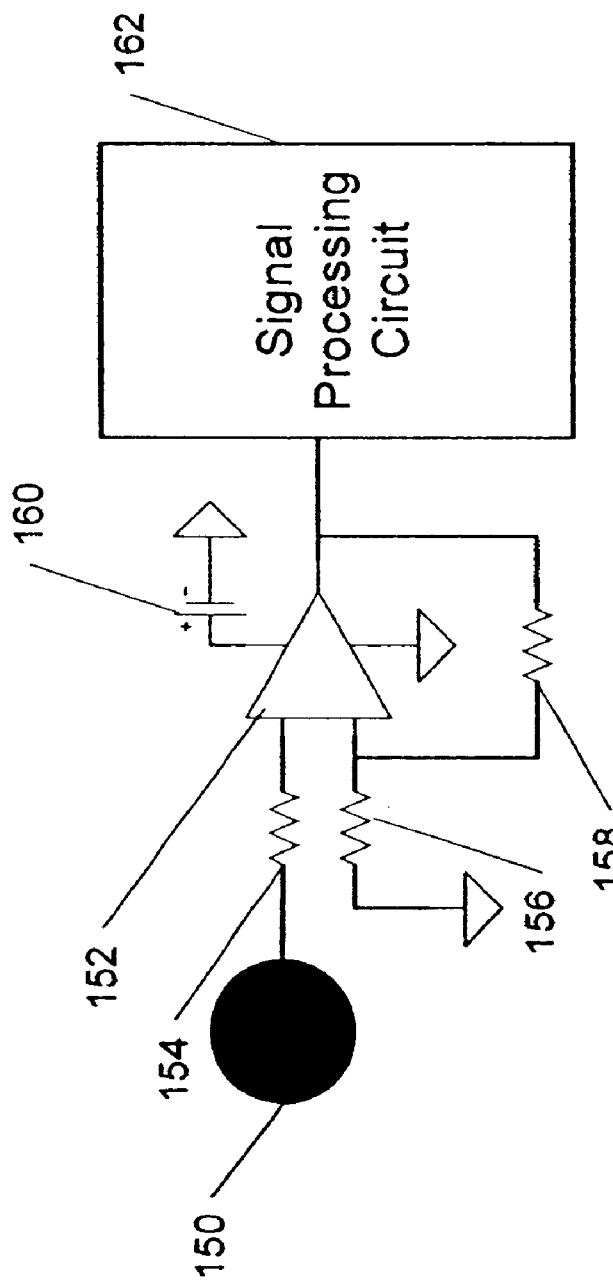
FIG. 8 illustrates an example of a single electrode sensor and a signal processing circuit for detecting and measuring changing electrostatic field in accordance with one embodiment of the invention.

FIG. 8 illustrates an example of a single electrode sensor and a signal processing circuit for detecting and measuring changing electrostatic field in accordance with one embodiment of the invention. In FIG. 8, a single electrode sensor 150 is coupled to a signal processing circuit 162. A single electrode sensor configuration can be constructed from a multi-electrode sensor configurations. For example, a single electrode sensor can be obtained from the double electrode sensor configuration such as shown in FIG. 6 by connecting one electrode to the ground plane of the circuit. Although a circular-shaped single electrode is shown in FIG. 8, other shapes may be used to implement the single electrode 150. For example, a square-shaped, triangle-shaped, or pentagon-shaped electrode may be used as the single electrode 150.

In operation, the sensing electrode 150 detects electric field and converts it into an electric signal. An op amp 152 and resistors 154, 156 and 158 provide amplification of the signal processing circuit 162. A power source 160 is provided to power the op amp 152.

Figure 9:
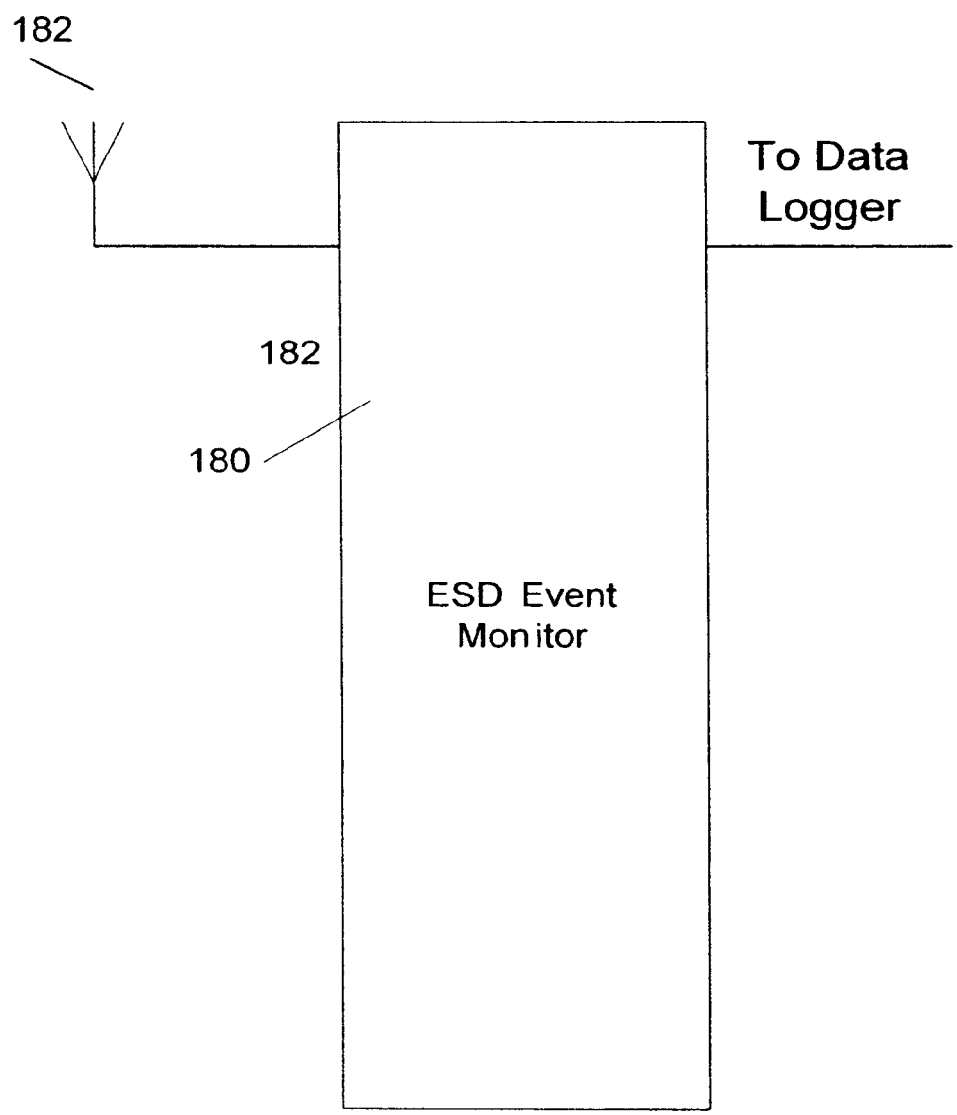
FIG. 9 is a diagram illustrating an electrostatic discharge (ESD) monitoring sensor that may be used to monitor ESD events.

FIG. 9 is a diagram illustrating an electrostatic discharge (ESD) sensor that may be used to monitor ESD events. In FIG. 9, an ESD event monitor is coupled to an antenna 182. An ESD event monitor of any suitable construction may be used as the ESD event monitor 160. Further details concerning ESD event monitors such as that shown in FIG. 9 may be found in U.S. patent application Ser. No. 09/551,412 entitled, "Electrostatic Discharge (ESD) Event Monitor," filed Apr. 18, 2000 which is incorporated herein by reference. The output of the ESD event monitor 180 is provided to a data logger such as the data logger 39.

Figure 10:
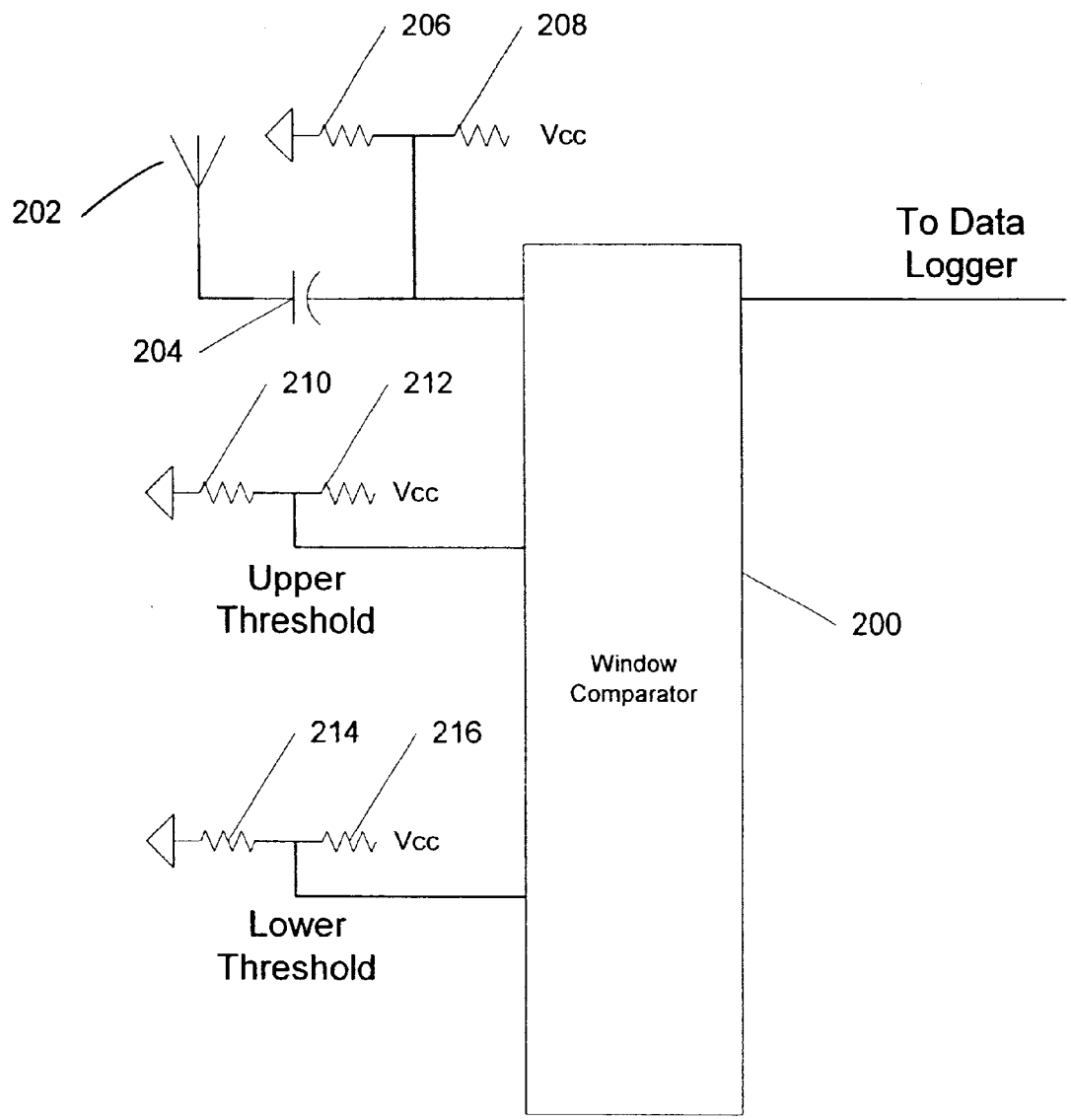
FIG. 10 illustrates a circuit diagram of an ESD event monitor constructed in accordance with one embodiment of the invention.

FIG. 10 illustrates a circuit diagram of an ESD event monitor constructed in accordance with one embodiment of the invention. In FIG. 10, an antenna 202 is coupled to a window comparator 200 (well-known in the art, and thus not shown in detail) via a capacitor 204. In operation, the window comparator 200 provides a logic-level signal whenever the input signal, or as in this particular case, the magnitude of an ESD event of any polarity exceeds a pre-determined threshold value. The antenna 202 detects a change in electromagnetic field caused by an ESD event and converts it into an electric signal. The capacitor 204 provides DC (direct current) decoupling of the electric signal received from the antenna 202 if necessary. Resistors 206 and 208 form bias circuit for the input signal. Voltage dividers comprising resistors 210, 212, 214 and 216 provide reference voltages for positive and negative peaks of an input signal. The output of the window comparator 200 is provided to a data logger such as the data logger 39 for further processing.

Often, there is a need to localize ESD events and filter and eliminate extraneous ESD events. For various reasons such as relative signal strength, an extraneous ESD event may be mistaken for a local ESD event. Extraneous ESD events refer to ESD events detected by the ESD sensor that do not cause electrostatic damages to the reticle because they occur at a location remote from the reticle such as on an apparatus or equipment. On the other hand, valid ESD events occur on the reticle itself or in a closer proximity thereto so that they can cause electrostatic damages to the reticle or an object of interest. Thus, in order to eliminate such extraneous ESD events, both electrostatic field and ESD may be monitored and localized in accordance with one embodiment of the invention. Table 1 shows an example of sensor data logged over a period of time by an electrostatic field sensor and an ESD sensor.

TABLE 1

| Entry No. | Time | Electrostatic Field (V) | ESD Events Detected |
| --- | --- | --- | --- |
| 1 | 9:53:22 | 2000 | 0 |
| 2 | 9:55:44 | 3420 | 1 |
| 3 | 10:00:28 | 1890 | 1 |
| 4 | 10:09:56 | 5230 | 18 |
| 5 | 10:12:18 | 20 | 2 |
| 6 | 10:14:40 | 3490 | 4 |
| 7 | 10:17:02 | 2800 | 0 |
| 8 | 10:19:24 | 800 | 0 |
| 9 | 10:21:46 | 120 | 0 |
| 10 | 10:35:58 | 4200 | 12 |
| 11 | 15:05:22 | 2900 | 2 |

Referring to Table 1, information in Table 1 can be used to localize ESD events and eliminate extraneous ESD events. For example, information entry 10 is likely to indicate valid ESD events on the reticle because they were accompanied by a high level of electrostatic field (4200 V). On the other hand, information logged in entry 5 is likely to indicate extraneous ESD events because even though there were ESD events detected, the level of electrostatic field detected was relatively low (20 V) so that the ESD events are not likely to have occurred on the reticle itself or in a sufficiently close proximity thereto.

It will be appreciated by one skilled in the art that various methods may be used to eliminate extraneous ESD events, and recognize valid ESD events. For example, occurrences of ESD event and electrostatic field may be separately recorded as illustrated in Table 1. Collected data then can be reviewed so that the ESD events that occur in the absence of electrostatic field are discarded as extraneous ESD events. Alternatively, extraneous ESD events may be eliminated by logging ESD events only when there is a certain level of electrostatic field build-up combined with an ESD detection. In yet another embodiment of the invention, an ESD event may be recorded only if there is an abrupt change in electrostatic field accompanying the ESD event.

The process of localizing ESD events and eliminating extraneous events may be implemented using hardware, software or in combination thereof. Using hardware, a localization circuit may be constructed using analog means or digital means in accordance with the invention. For example, analog means may comprise an analog comparator for detecting electrostatic field having a magnitude exceeding a certain predetermined value. If the magnitude of electrostatic field exceeds the predetermined value, the signal from an ESD sensor is reported as a valid ESD signal. Otherwise, the ESD sensor signal is blocked.

Digital means may comprise an analog to digital converter (ADC) for converting ESD sensor and electrostatic field sensor outputs, and a comparator for detecting electrostatic field having a magnitude exceeding the predetermined value. The outputs of the ADC and the comparator may then be fed into a logic AND gate so that if the magnitude of electrostatic field exceeds the predetermined value, a valid ESD signal is genearated. Otherwise, the ESD event is not reported.

ESD events may also be localized based on changing electrostatic field. In this case, analog means may comprise a high-pass filter to detect changes in electrostatic field. If the rate of change in electrostatic field exceeds a predetermined value, the signal from an ESD sensor is reported. Otherwise, the ESD sensor signal is blocked. Digital means may comprise an analog to digital converter (ADC) for converting ESD sensor and electrostatic field sensor outputs and a digital circuit to implement the high-pass filtering function. The outputs of the high pass filter and the ESD sensor may be fed into a logic AND gate so that if the rate of change in electrostatic field exceeds the predetermined value, the ESD event detection is reported. Otherwise, the ESD event is not reported. It will be appreciated by one skilled in the art that many variations are possible to implement the analog and digital means for localizing ESD events. For example, the high pass filter function may be implemented using software or firmware codes executable by a microprocessor.

The foregoing description, for purposes of explanation, used specific nomenclature to provide a thorough understanding of the invention. In some instances, well known circuits and devices are shown in block diagram form in order to avoid unnecessary distraction from the underlying invention. The foregoing descriptions of preferred embodiments of the invention are presented for purposes of illustration and description, and they are not intended to be exhaustive or to limit the invention to the precise forms disclosed. It will be appreciated by those skilled in he art that changes in this embodiment may be made without departing from the principles and spirit of the invention, the scope of which is defined by the appended claims.

What is claimed is:

1. A method for localizing electrostatic discharges (ESD) by detecting electrostatic discharges and electrostatic field, the method comprising:

detecting an electrostatic discharge and converting it into a first output;

detecting said electrostatic field and converting it into a second output;

determining a valid local electrostatic discharge based on said first and second outputs; and correlating the valid local electrostatic discharge with a stage of a fabrication process to create a log of electrostatic discharges occurring at different stages of the fabrication process.

2. The method of claim 1 wherein said determining comprises determining said valid local electrostatic discharge when said electrostatic discharge is combined with said electrostatic field having a magnitude that exceeds a predetermined value.

3. The method of claim 2 further comprising converting said first and second outputs to first and second digital data, respectively.

4. A device for localizing electrostatic discharges affecting a unit by detecting an electrostatic discharge and electrostatic field, the device comprising:

an electrostatic sensor for detecting said electrostatic field affecting said unit and generating a first output;

an ESD sensor for detecting said electrostatic discharge affecting said unit and generating a second output; and a means for correlating a process stage with the electrostatic discharge to create a log of electrostatic discharge occurring at different stages of a fabrication process.

5. The device of claim 4 further comprising:

an analog comparator coupled to said first output for generating a comparator output when said electrostatic field has a magnitude exceeding a predetermined value.

6. The device of claim 5 further comprising:

a circuit coupled to said analog comparator and to said ESD sensor for receiving said comparator output and said second output, said circuit configured to generate a valid ESD signal when said comparator output and said second output are detected.

7. The device of claim 4 further comprising:

an analog to digital converter (ADC) coupled to said electrostatic sensor and said ESD sensor for converting said first and second outputs to first and second digital data, respectively.

8. The device of claim 7 further comprising:

a digital comparator coupled to said first data and generating a comparator output when said electrostatic field has a magnitude exceeding a predetermined value.

9. The device of claim 8 further comprising:

a circuit coupled to said digital comparator and to said ADC for receiving said comparator output and said second data, said circuit configured to generate a valid ESD signal when said comparator output and said second data are detected.

10. The device of claim 9 wherein said circuit is an AND gate.

11. The device of claim 10 further comprising:

a data logger comprising a timestamping module for logging said first and second digital data.

12. The device of claim 11 further comprising an RF (radio frequency) communication module coupled to said data logger.

13. A method for localizing electrostatic discharges (ESD) by detecting electrostatic discharges and electrostatic field, the method comprising:

detecting an electrostatic discharge and converting it into a first output;

detecting a change in said electrostatic field and converting it into a second output;

determining a valid local electrostatic discharge based on said first and second outputs; and correlating the valid local electrostatic discharge with a stage of a fabrication process to create a log of electrostatic discharges occurring at different stages of the fabrication process.

14. The method of claim 13 wherein said determining comprises determining said valid local electrostatic discharge when said electrostatic discharge is combined with said electrostatic field changing at a rate that exceeds a predetermined value.

15. The method of claim 14 further comprising converting said first and second outputs to first and second digital data, respectively.

16. A device for localizing electrostatic discharges affecting a unit, the device comprising:
an electrostatic sensor for detecting a change in said electrostatic field and generating a first output;
an ESD sensor for detecting said electrostatic discharge and generating a second output; and
a means for correlating a process stage with the electrostatic discharge to create a log of electrostatic discharge occurring at different stages of a fabrication process.

17. The device of claim 16 further comprising:
a high pass filter coupled to said first output for generating a high pass filter output when said electrostatic field changes at a rate exceeding a predetermined value.

18. The device of claim 17 further comprising:
a circuit coupled to said high pass filter and to said ESD sensor for receiving said high pass filter output and said second output, said circuit configured to generate a valid ESD signal when said high pass filter output and said second output are detected.

19. The device of claim 18 further comprising:
an analog to digital converter (ADC) coupled to said electrostatic sensor and said ESD sensor for converting said first and second outputs to first and second digital data, respectively.

20. The device of claim 19 further comprising:
a high pass filter coupled to said first data for generating a high pass filter output when said electrostatic field changes at a rate exceeding a predetermined value.

21. The device of claim 20 wherein said high pass filter comprises software codes executable by a microprocessor.

22. The device of claim 20 further comprising:
a circuit coupled to said high pass filter and to said ADC for receiving said high pass filter output and said second data, said circuit configured to generate a valid ESD signal when said high pass filter output and said second data are detected.

23. The device of claim 22 wherein said circuit is an AND gate.

24. The device of claim 23 further comprising:
a data logger comprising a timestamping module for logging said first and second digital data.

25. The device of claim 24 further comprising an RF (radio frequency) communication module coupled to said data logger.

* * * * *